United States Patent [19]

Reiner

[11] 4,419,595
[45] Dec. 6, 1983

[54] ANALOG OR GATE CIRCUIT

[75] Inventor: Richard W. Reiner, Westlake Village, Calif.

[73] Assignee: The United States of America as represented by the Secretary of the Air Force, Washington, D.C.

[21] Appl. No.: 311,378

[22] Filed: Oct. 14, 1981

[51] Int. Cl.³ .............................................. H03K 5/24
[52] U.S. Cl. ................................... 307/355; 307/357; 307/445; 328/117; 328/147
[58] Field of Search ............... 307/351, 356, 355, 357, 307/445; 328/104, 155, 117, 137, 147

[56] References Cited

U.S. PATENT DOCUMENTS

| 3,480,794 | 11/1969 | Richman | 307/229 |
| 3,758,867 | 9/1973 | Schulz | 307/357 |
| 3,800,164 | 3/1974 | Miller | 307/351 |
| 4,225,795 | 9/1980 | Keeney | 307/355 |

Primary Examiner—John Zazworsky
Attorney, Agent, or Firm—Donald J. Singer; Willard R. Matthews

[57] ABSTRACT

The maximum instantaneous value of analog signals from multiple sources is detected by means of an analog OR gate circuit in which the analog signal from each input is connected to both a positive and a negative half wave rectifier circuit. The outputs of the positive half wave rectifier circuit are OR wired together and the outputs of the negative half wave rectifier circuits are OR wired together and the OR outputs of both are summed to provide an output signal that is the maximum peak instantaneous signal. Because the maximum instantaneous signal from any channel reverse biases the other rectifiers, other signals are neither added nor subtracted from the output.

4 Claims, 1 Drawing Figure

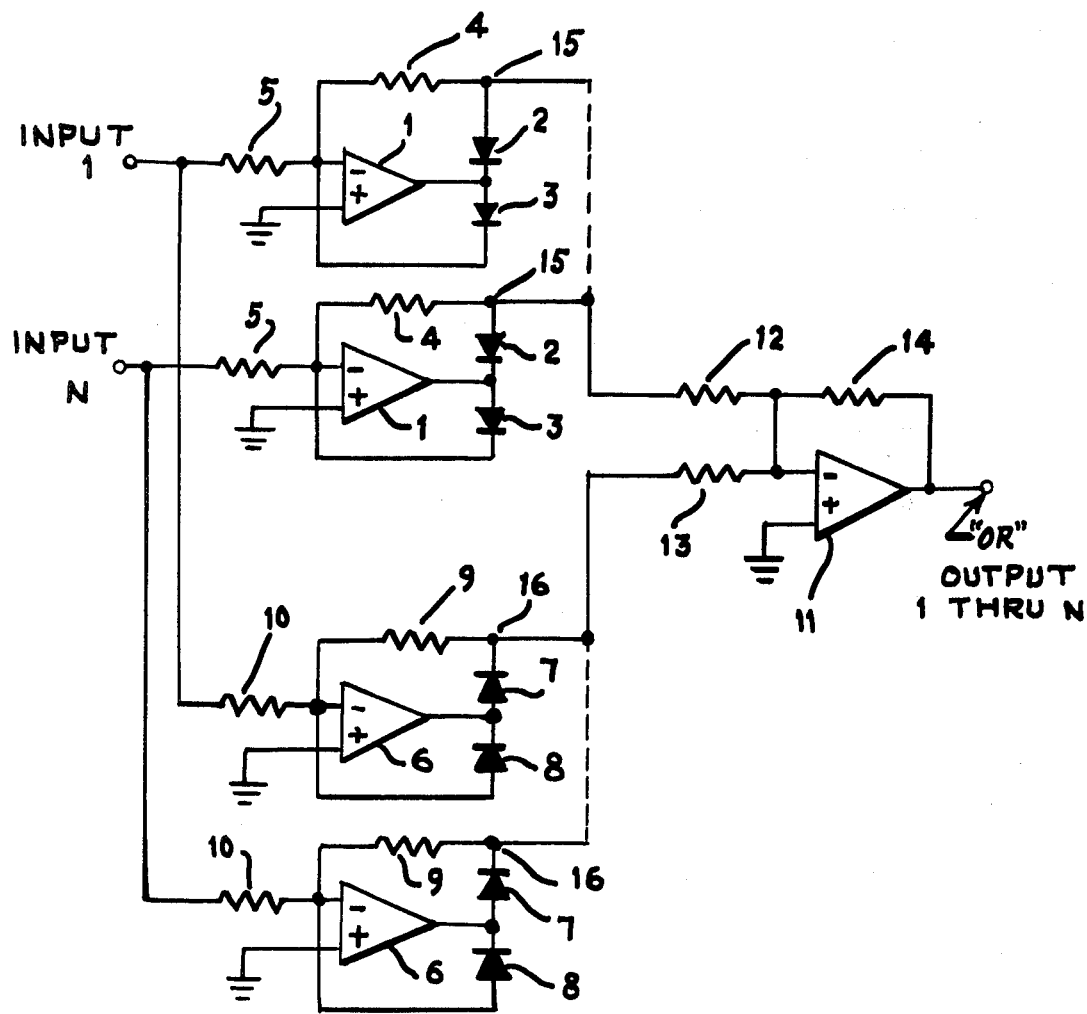

ANALOG OR GATE CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates to the detection of the maximum instantaneous value of analog signals from multiple sources such as is required in autofocus systems and the like, and in particular the invention relates to gating circuits for accomplishing that end.

The autofocus concept is based on the principle that as an imaging system comes into focus the peak video outputs from detector electronics increase in amplitude to a maximum value. To insure that the autofocus system works under all field conditions, the system must direct the maximum instantaneous video from any channel of a multi-channel scanning seeker and not add or subtract the channels video. Infrared imaging carousel systems have one or more video channels. Present systems typically have four video outputs.

The detection of the maximum instantaneous value of signals from multiple sources has, in the past, been accomplished by either diode OR gate circuits or by common emitter transistor OR gate circuits. These circuits, however, have been found to be deficient in various aspects. Diode OR gate circuits are not linear, have temperature dependent threshold voltage, require matched parts, and have an output impedance that is dependent upon load current. Common emitter transmitter OR gate circuits require matched parts, have a limited dynamic range, and have a voltage gain that is less than unity.

The present invention is directed toward providing an analog OR gate circuit that is an improvement over such circuits and that is not subject to the various deficiencies enumerated above.

SUMMARY OF THE INVENTION

The invention is an analog OR gate circuit for detecting the maximum peak instantaneous signal value from any one of a number of analog input signals. The input signal for each input is connected to a positive and a negative half wave rectifier section. Each half wave rectifier section comprises an operational amplifier, feedback diodes and resistors. The outputs of positive rectifier sections are connected OR together and the outputs of the negative rectifier sections are connected OR together. The OR outputs are summed to produce a maximum composite video output signal. The maximum instantaneous video signal from any channel reverse biases the other rectifiers causing the operational amplifier outputs to approach zero, leaving only the maximum peak video present at the output.

It is a principal object of the invention to provide a new and improved analog OR gate circuit for detecting the maximum instantaneous value of analog signals from multiple sources.

It is another object of the invention to provide an analog OR gate circuit of the type described that has a threshold voltage that is temperature independent.

It is another object of the invention to provide an analog OR gate circuit of the type described that has a linear response.

It is another object of the invention to provide an analog OR gate circuit of the type described that does not require matched parts.

It is another object of the invention to provide an analog OR gate circuit of the type described in which the output impedance is independent of load current.

It is another object of the invention to provide an analog OR gate circuit of the type described that has greater dynamic range than common emitter transistor OR gate circuits.

It is another object of the invention to provide an analog OR gate circuit of the type described wherein the quiescent output voltage is zero volts dc when the input voltage is zero volts dc and the quiescent output voltage is temperature independent.

It is another object of the invention to provide an analog OR gate circuit of the type described wherein voltage gain is equal to or greater than unity.

These, together with other objects features and advantages of the invention will become more readily apparent from the following detailed description when taken in conjunction with the illustrative embodiment in the accompanying drawing.

DESCRIPTION OF THE DRAWING

The sole FIGURE of the drawing is a schematic diagram of one presently preferred embodiment of the invention.

DETAILED DESCRIPTION OF THE PREFERRED EMBODIMENT

The invention is illustrated by the schematic diagram of the sole FIGURE of the drawing. Referring thereto, any number of inputs (1 through N) receives the analog signals from the detector electronics (not shown). Each input signal is fed to both a positive half wave rectifier circuit and an negative half wave rectifier circuit as shown.

Each positive half wave rectifier circuit comprises an operational amplifier 1 having an output, a negative input and a positive input which is grounded. An input resistor 5 is connected between the gate circuit input and the negative operational amplifier input. The output of operational amplifier 1 is connected to the cathode of rectifier 2 and the anode of rectifier 3 and feedback resistor 4 is connected in series between the anode of rectifier 2 and the negative input of the operational amplifier. The cathode of rectifier 3 is also connected to the negative input of the operational amplifier to complete the feedback loop. The output for this positive half wave rectifier circuit is obtained at the junction 15 of feedback resistor 4 and the anode of rectifier 2.

Each negative half wave rectifier circuit comprises an operational amplifier 6, an input resistor 10, a feedback resistor 9, and rectifiers 7 and 8. The circuit arrangement of the negative half wave rectifier circuit is the same as that of the positive half wave rectifier circuit except for the orientation of rectifiers 7 and 8. Output from the negative half wave rectifier circuit is taken from the junction 16 of feedback resistor 9 and the cathode of rectifier 7.

The summing and output circuit of the analog OR gate circuit comprises summing resistors 12, 13, operational amplifier 11 and (output) feedback resistor 14.

As illustrated by the FIGURE and as described above, the circuit of the invention consists of two sections of half wave rectifiers connected to each input signal, one section for positive signals and the other section for negative signals. The outputs from all the positive rectifiers are wired OR together and the outputs from all the negative rectifiers are wired OR together. These positive and negative outputs are then summed together by the summing and output circuit to produce the maximum composite video output signal. The maximum instantaneous video signal from any channel will reverse bias the output diodes of the other wired OR rectifiers which in turn will cause the operational amplifier output of these rectifiers to approach zero volts. Therefore, only the maximum peak video will be present at the output and the signals will not add or subtract. The gain of the OR gate is determined by the ratio of the input and feedback resistors. In a practical application, the values of these resistors can be equal. the matching of the rectifiers is primarily determined by the tolerance of the resistors.

While the invention has been described in its preferred embodiment, it is understood that the words which have been used are words of description rather than words of limitation and that changes within the purview of the appended claims may be made without departing from the scope and spirit of the invention in its broader aspects.

What is claimed is:

1. An analog OR gate circuit for detecting the maximum instantaneous value of analog signals from multiple sources comprising:
   a multiplicity of gate circuit inputs, each receiving a discrete analog input signal,
   a gate circuit output,
   a positive half wave rectifier circuit connected to each said gate circuit input,
   a negative half wave rectifier circuit connected to each said gate circuit input, the outputs of said positive half wave rectifier circuits connected to provide an OR output, the outputs of said negative half wave rectifier circuits connected to provide an OR output, and
   summing means summing said OR outputs and providing an output to said gate circuit output.

2. An analog OR gate circuit as defined in claim 1 wherein each said positive half wave rectifier circuit comprises:
   an operational amplifier having a positive input and a negative input and an output, said positive input connected to ground,
   an input resistor connected between a gate circuit input and the negative input of said operational amplifier,
   a feedback resistor, and
   first and second half wave rectifiers, each having an anode and a cathode, the output of said operational amplifier connected to the cathode of said first rectifier and the anode of said second rectifier, the cathode of said second rectifier connected to the negative input of said operational amplifier, said feedback resistor connected between the negative input of said operational amplifier and the anode of said first rectifier, the junction of said feedback resistor and the anode of said first rectifier providing the half wave rectifier circuit output; and,
   wherein each said negative half wave rectifier circuit comprises:
   an operational amplifier having a positive input and a negative input and an output, said positive input connected to ground,
   an input resistor connected between a gate circuit input and the negative input of said operational amplifier,
   a feedback resistor, and
   first and second half wave rectifiers, each having an anode and a cathode, the output of said operational amplifier connected to the cathode of said first rectifier and the anode of said second rectifier, the anode of said first rectifier connected to the negative input of said operational amplifier, said feedback resistor connected between the negative input of said operational amplifier and the cathode of said second rectifier, the junction of said feedback resistor and the cathode of said second rectifier providing the half wave rectifier circuit output.

3. An analog OR gate circuit as defined in claim 2 wherein said summing means comprises
   an operational amplifier having an output, a negative input and a positive input, said positive input connected to ground and said output connected to said gate circuit output,
   an output resistor connected between the output and negative input of said operational amplifier,
   a first summing resistor connected between the the OR output of said positive half wave rectifier circuit and the negative input of said operational amplifier, and
   a second summing resistor connected between the OR output of said negative half wave rectifier circuit and the negative input of said operational amplifier.

4. An analog OR gate circuit as defined in claim 3 wherein the value of the resistance of said input resistor is equal to the resistance of said feedback resistor in each half wave rectifier circuit.

* * * * *